United States Patent
Hrametz et al.

(10) Patent No.: US 9,357,657 B2
(45) Date of Patent: May 31, 2016

(54) LEAD-FREE SOLDER ALLOY FOR PRINTED CIRCUIT BOARD ASSEMBLIES FOR HIGH-TEMPERATURE ENVIRONMENTS

(71) Applicant: Halliburton Energy Services, Inc., Houston, TX (US)

(72) Inventors: Andrew Albert Hrametz, Rosenberg, TX (US); Alexander T. Duncan, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 14/814,015

(22) Filed: Jul. 30, 2015

(65) Prior Publication Data

US 2015/0328723 A1    Nov. 19, 2015

(51) Int. Cl.
| | |
|---|---|
| H05K 3/34 | (2006.01) |
| C22C 13/02 | (2006.01) |
| E21B 49/00 | (2006.01) |
| B23K 35/26 | (2006.01) |
| C22C 13/00 | (2006.01) |

(52) U.S. Cl.
CPC .......... H05K 3/3463 (2013.01); B23K 35/262 (2013.01); C22C 13/00 (2013.01); C22C 13/02 (2013.01); E21B 49/00 (2013.01); H01L 2924/0002 (2013.01)

(58) Field of Classification Search
CPC ..... H05K 3/3463; C22C 13/02; B23K 35/262
USPC ......................................... 29/839
See application file for complete search history.

(56) References Cited

U.S. PATENT DOCUMENTS

| | | |
|---|---|---|
| 5,346,775 A | 9/1994 | Jin et al. |
| 2005/0100474 A1 | 5/2005 | Haung et al. |
| 2005/0151233 A1 | 7/2005 | Deepak et al. |

FOREIGN PATENT DOCUMENTS

| | | |
|---|---|---|
| CA | 2641812 C | 6/2008 |
| WO | WO-2005099961 A1 | 10/2005 |
| WO | WO-2008073090 A1 | 6/2008 |

OTHER PUBLICATIONS

"U.S. Appl. No. 12/517,652 , Response filed Jun. 5, 2012 to Final Office Action mailed Jan. 19, 2012", 10 pgs.
"U.S. Appl. No. 12/517,652 , Response filed Oct. 31, 2011 to Non Final Office Action mailed Oct. 18, 2011", 8 pgs.
"U.S. Appl. No. 12/517,652, Advisory Action mailed Jul. 9, 2012", 3 pgs.
"U.S. Appl. No. 12/517,652, Advisory Action mailed Nov. 19, 2014", 3 pgs.
"U.S. Appl. No. 12/517,652, Examiner Interview Summary mailed Apr. 16, 2015", 3 pgs.
"U.S. Appl. No. 12/517,652, Examiner Interview Summary mailed Jun. 7, 2012", 3 pgs.

(Continued)

*Primary Examiner* — Weiping Zhu
(74) *Attorney, Agent, or Firm* — Schwegman Lundberg & Woessner, P.A.; Benjamin Fite

(57) ABSTRACT

A solder alloy suitable for high temperature environments, such as for example electronic systems used in an oil or gas well where the temperature may be in the region of 175° C., the solder alloy having a Silver weight % in the range of 3.5 to 7.0, a Copper weight % in the range of 1.0 to 4.0, and an Antimony weight % in the range of 1.0 to 3.0. Other embodiments are described and claimed.

12 Claims, 2 Drawing Sheets

(56) References Cited

OTHER PUBLICATIONS

"U.S. Appl. No. 12/517,652, Final Office Action mailed Jan. 19, 2012", 9 pgs.
"U.S. Appl. No. 12/517,652, Final Office Action mailed Sep. 10, 2014", 8 pgs.
"U.S. Appl. No. 12/517,652, Non Final Office Action mailed Jan. 9, 2015", 7 pgs.
"U.S. Appl. No. 12/517,652, Non Final Office Action mailed Mar. 4, 2014", 8 pgs.
"U.S. Appl. No. 12/517,652, Non Final Office Action mailed Oct. 18, 2011", 7 pgs.
"U.S. Appl. No. 12/517,652, Notice of Allowance mailed Jun. 5, 2015", 8 pgs.
"U.S. Appl. No. 12/517,652, Response filed Mar. 15, 2011 to Restriction Requirement mailed Feb. 22, 2011", 5 pgs.
"U.S. Appl. No. 12/517,652, Response filed May 8, 2015 to Non Final Office Action mailed Jan. 9, 2015", 10 pgs.
"U.S. Appl. No. 12/517,652, Response filed Aug. 4, 2014 to Non Final Office Action mailed Mar. 4, 2014", 8 pgs.
"U.S. Appl. No. 12/517,652, Response filed Nov. 10, 2014 to Final Office Action mailed Sep. 10, 2014", 8 pgs.
"U.S. Appl. No. 12/517,652, Restriction Requirement mailed Feb. 22, 2011", 5 pgs.
"Canadian Application Serial No. 2,641,812, Office Action mailed Jun. 12, 2013", 2 pgs.
"Canadian Application Serial No. 2,641,812, Response filed Dec. 10, 2013 to Office Action mailed Jun. 12, 2013", 10 pgs.
"European Application Serial No. 06849954.0, Extended European Search Report mailed Nov. 24, 2010", 6 pgs.
"European Application Serial No. 06849954.0, Office Action mailed Dec. 13, 2010", 1 pg.
"European Application Serial No. 06849954.0, Response filed Jun. 13, 2011 to Office Action mailed Dec. 13, 2010", 14 pgs.
"International Application Serial No. PCT/US2006/047586, International Preliminary Report on Patentability dated Jun. 16, 2009", 4 pgs.
"International Application Serial No. PCT/US2006/047586, International Search Report mailed Nov. 16, 2007", 1 pg.
"International Application Serial No. PCT/US2006/047586, Written Opinion mailed Nov. 16, 2007", 3 pgs.

LEAD-FREE SOLDER ALLOY FOR PRINTED CIRCUIT BOARD ASSEMBLIES FOR HIGH-TEMPERATURE ENVIRONMENTS

CROSS-REFERENCE TO RELATED APPLICATIONS

This application is a divisional application of U.S. patent application Ser. No. 12/517,652, filed on Jun. 4, 2009, which application is a U.S. National Stage Filing under 35 U.S.C. 371 from International Application No. PCT/US2006/047586, filed on Dec. 13, 2006, and published as WO 2008/073090 on Jun. 19, 2008; the disclosures of which are incorporated herein by reference as if reproduced herein in their entireties.

FIELD

Embodiments of the present invention relate to solder alloys.

BACKGROUND

Solder is a ubiquitous product used in the electronic industry to attach electronic components, such as integrated circuit packages and passive components, to circuit boards, to electrically connect such electronic components to traces on a circuit board in order to realize electronic systems, and to help dissipate heat.

In some applications, electronic systems are expected to survive harsh conditions. For example, in the oil well logging industry, various tools are employed to investigate formation conditions, and such tools often employ sophisticated electronic systems. Wireline logging tools, logging-while-drilling tools, and other types of downhole tools often operate at temperatures from 150° C. to 175° C.

Lead (Pb) has long been a component of solder used in the electronic industry. Some governing bodies, such as the European Union, have banned solder in which lead is a component because of the concern that the lead may pose an environmental and health hazard. It is expected that other governing bodies, or governments, may place taxes, restrictions, or bans on solder with lead. Because of this, there has been much research in developing lead-free solder for the electronics industry.

Accordingly, it is useful to provide a lead-free solder alloy suitable for high-temperature environments.

DESCRIPTION OF EMBODIMENTS

In the descriptions that follow, the scope of the term "some embodiments" is not to be so limited as to mean more than one embodiment, but rather, the scope may include one embodiment, more than one embodiment, or perhaps all embodiments.

High temperature thermal cycling and heat exposure commonly cause damage to a solder joint, generally resulting in changes to the solder microstructure over time, even though its appearance may seem the same. Changes to the solder microstructure usually affect the properties of the solder and the solder joint itself. Some known lead-free solders containing very large percentages of Tin (Sn) exhibit strong IMC (intermetallic compound) bonding and good IMC development, but it has been found that for some of these known solder alloys, exposure to temperatures in the region of 175° may accelerate rapid growth of and changes in the microstructure interfaces and in the IMC layers. The rapid intermetallic growth between interfacial layers creates diffusion voiding adjacent to the component leads and solder pads, which reduces the solder joint strength in these areas.

Figure 1:
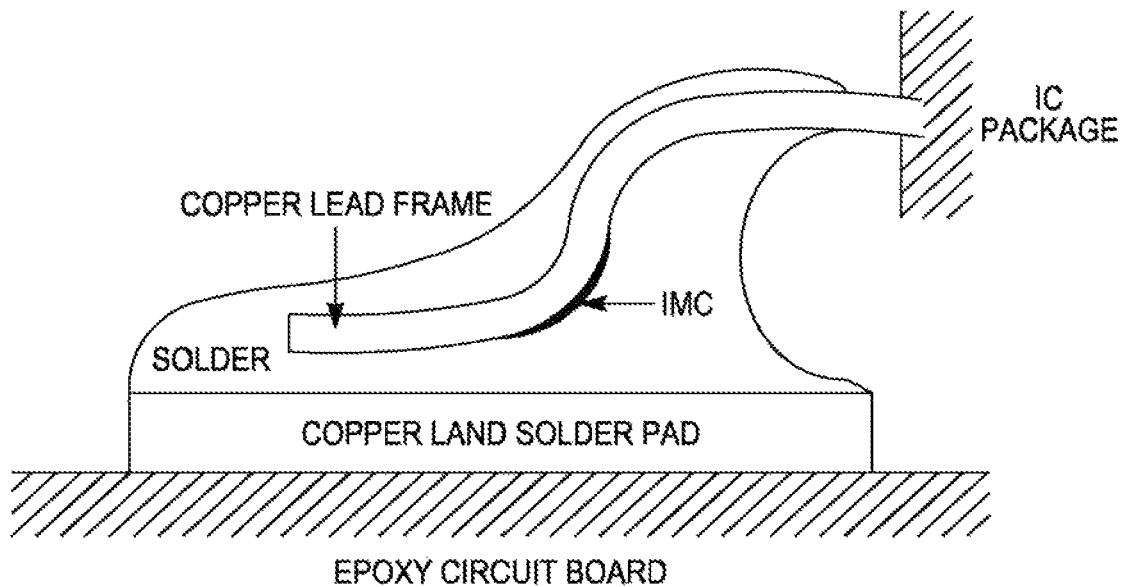
FIG. 1 illustrates a prior art normal solder joint.
Figure 2:
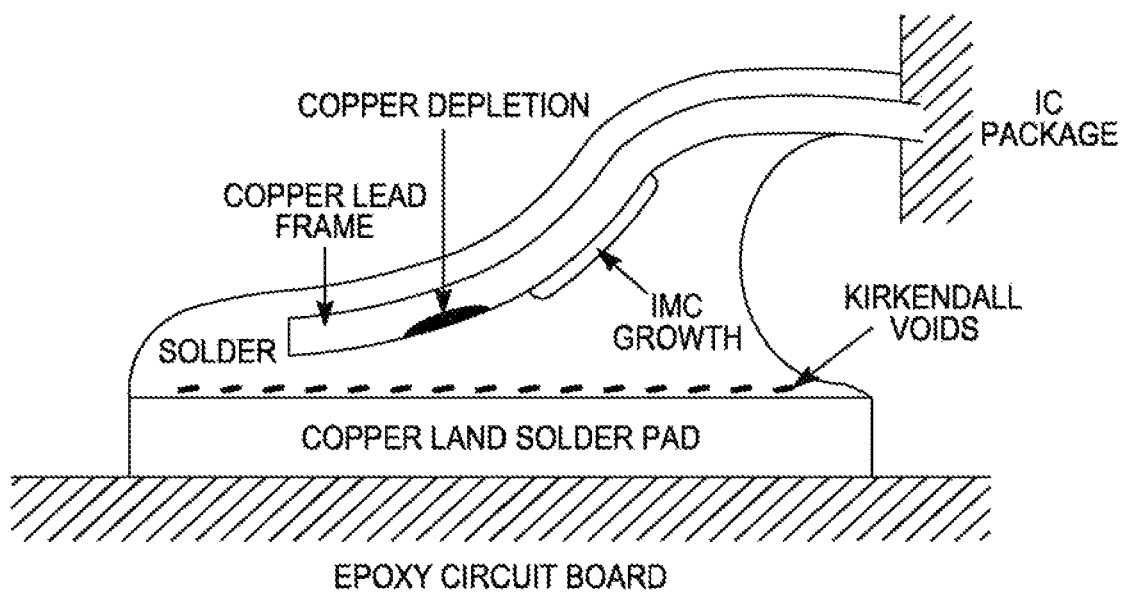
FIG. 2 illustrates a prior art solder joint with damage due to high temperature.

FIGS. 1 and 2 are simplified illustrations of typical photomicrographs of a solder joint. FIG. 1 illustrates a solder joint without damage. In FIG. 1, an integrated circuit (IC) package with a copper lead frame is soldered to a copper land solder pad. The copper land solder pad is formed on an epoxy circuit board. FIG. 1 also illustrates an IMC layer. FIG. 2 illustrates typical damage that may occur to a solder joint at high temperature, such as for example 185° C. In FIG. 2, copper depletion is indicated, as well as extreme IMC growth. Furthermore, Kirkendall voids are indicated in FIG. 2.

It has been found that solder alloy having a range of 3.5 to 7.0 weight % Silver (Ag), a range of 1.0 to 4.0 weight % Copper (Cu), a range of 1.0 to 3.0 weight % Antimony (Sb), and where the remainder is Sn, has desirable properties in a high temperature environment, such as the environment experienced by a well logging tool. It is found that such solder alloys have a melting temperature above 175° C., and for some embodiments, the melting temperature is around 220° C. Such solder alloys have a relatively wide plastic range, i.e., the difference in liquidus and solidus temperatures may be relatively large for such solder alloys. However, this is not a problem in the high temperature environment of an oil or gas well.

Figure 4:
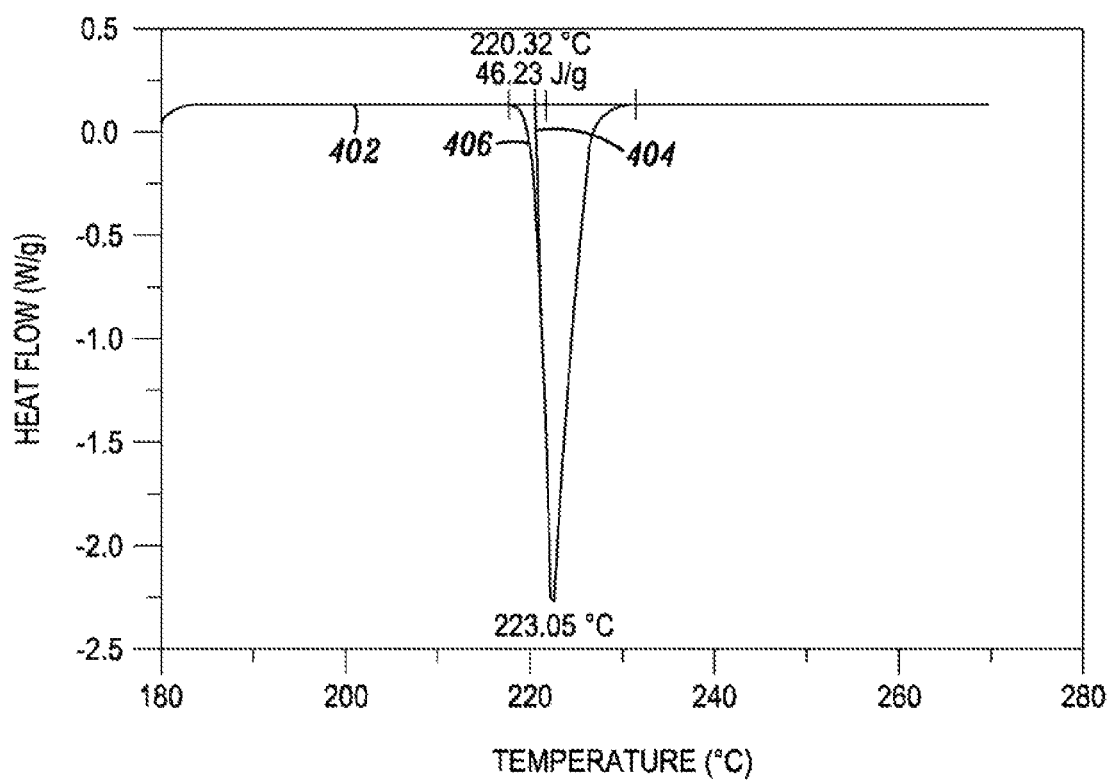
FIG. 4 illustrates a thermal analysis curve for an embodiment using differential scanning calorimetry.

As an example of a particular embodiment, a solder alloy may consist of 4.7 weight Ag, 1.7 weight % Cu, 1.5 weight % Sb, and 92.1 weight Sn. An example of a thermal analysis curve for such an embodiment is illustrated in FIG. 4, where the sample mass is 7.9 mg. The thermal analysis curve in FIG. 4 was obtained by differential scanning calorimetry. Line 402 may serve as a reference, indicating the heat flow when the sample is not experiencing a change in state. The sample is heated up in an adiabatic chamber with a reference sample that does not change state over the temperature measurement range. The x-axis is the temperature of the reference sample in units of Celsius, and the y-axis measures heat flow in or out of the sample in units of watts/gram. Solidus is at around 219.5° C., where the sample begins to melt. Because in general heat capacity increases at a phase transition, above the solidus, it is seen that the heat flow into the sample increases rapidly. The heat flow is negative, indicating that heat is flowing into the sample (endothermic). Line 404 is a tangent to curve 406, and the intersection of line 404 with reference line 402 may be taken as the melting point, which is about 220.32° C. As the sample is heated, it eventually turns into a liquid, where the liquidus is seen to be at around 232° C.

It is found that the addition of Sb slightly increases the solidus temperature. It is found that having more Cu may slow down IMC layer formation. The inclusion of Sb is found to make the solder stronger. That is, there is greater ductile strength and better resistance to degradation so that changes in the solder properties due to time and temperature are mitigated. In addition to the above-cited elements, some embodiment solder alloys may have a trace amount of Zinc (Zn) in the range of 0.1 to 1.0 weight %. It has been found that Zn may slow down the formation of Kirkendall voids.

Standard techniques may be employed to manufacture the above-described embodiments into a solder paste. It is expected that the above-described embodiments may be used for solder in surface mount technology (SMT), or through-hole technology, and for various IC packages, such as ball grid array (BGA) packages, framelead and leadless frame packages, dual in-line packages (DIPs), small outline integrated circuits (SOICs), quad flat packages (QFPs), and chip scale packages (CSPs), to name a few. The above-described embodiments may also be used for passive and active components. Standard techniques may also be employed to manufacture wire-form solder having the disclosed compositions.

Before components are soldered to a board, the leads are often coated with a protective finish. The protective finish may need to be removed before soldering with an embodiment solder if there are elements in the protective finish that are not compatible with the embodiment solder. That is, the presence of some elements in the protective finish may degrade the resulting solder joint. For example, it is found that Indium, Lead, or Gold in a protective finish is not compatible, if the protective finish is not compatible, then it should be stripped off of the leads. Some protective finishes need not be removed, however. For example, a protective finish consisting of only Sn need not be removed.

Figure 3:
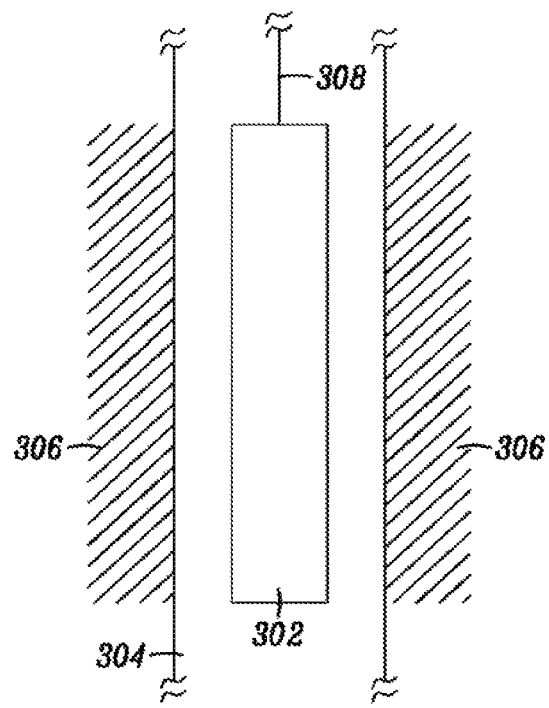
FIG. 3 illustrates a well logging tool employing an embodiment of the present invention.

It is expected that embodiments of the present invention may find application to various electronic systems used in relatively high temperature environments. As a particular example, it is expected that embodiments of the present invention may find application, in electronic systems used in a well logging tool. Such an example application is illustrated in simple fashion in FIG. 3, were logging tool 302 in well hole 304 measures various physical properties of formation 306. Well logging tool 302 may be a wireline tool, where wire 308 provides various signal information to instruments on the surface (not shown).

Various modifications may be made to the disclosed embodiments without departing from the scope of the invention as claimed below.

What is claimed is:

1. A well logging tool comprising:
   an electronic system, the electronic system including one or more solder joints formed from a premelted solid lead-free wire-form solder having a preliminary solid solder alloy composition consisting of:
   Silver;
   Copper;
   Antimony; and
   Tin;
   wherein the preliminary solid solder alloy composition has a weight % of the Silver in a range of 3.5 to 7.0, a weight % of the Copper in a range of 1.0 to 4.0, and a weight % of the Antimony in a range of 1.0 to 3.0.

2. The well logging tool as set forth in claim 1, wherein the preliminary solid solder alloy has 4.7 weight % Silver, 1.7 weight % Copper, and 1.5 weight % Antimony.

3. A well logging tool comprising:
   an electronic system, the electronic system including one or more solder joints formed from a premelted solid lead-free wire-form solder having a preliminary solid solder alloy composition consisting of:
   Silver;
   Copper;
   Antimony;
   Zinc; and
   Tin;
   wherein the preliminary solid solder alloy composition has a weight % of the Silver in a range of 3.5 to 7.0, a weight % of the Copper in a range of 1.0 to 4.0, a weight % of the Antimony in a range of 1.0 to 3.0; and a weight % of the Zinc in a range of 0.1 to 1.0.

4. The well logging tool as set forth in claim 3, wherein the preliminary solid solder alloy has 4.7 weight % Silver, 1.7 weight % Copper, and 1.5 weight % Antimony.

5. A well logging tool comprising:
   an electronic system, the electronic system including one or more solder joints formed from a premelted solid lead-free wire-form solder having a preliminary solid solder alloy composition comprising:
   Silver;
   Copper;
   Antimony; and
   Tin;
   wherein the solder alloy composition has a weight % of the Silver in a range of 3.5 to 7.0, a weight % of the Copper in a range of 1.0 to 4.0, a weight % of the Antimony in a range of 1.0 to 3.0, and the remainder Tin.

6. The well logging tool as set forth in claim 5, wherein the preliminary solid solder alloy composition comprises about 4.7 weight % Silver, about 1.7 weight % Copper, about 1.5 weight % Antimony, and the remainder Tin.

7. The well logging tool as set forth in claim 6, wherein the preliminary solid solder composition further comprises Zinc.

8. The well logging alloy as set forth in claim 7, wherein the preliminary solid solder alloy composition has a weight % of the Zinc in a range of 0.1 to 1.0.

9. The well logging tool as set forth in claim 8, wherein the preliminary solid solder alloy composition has a weight % of the Tin in a range of 85.0 to 94.4.

10. The well logging tool as set forth in claim 5, wherein the preliminary solid solder alloy composition has a weight % of the Tin in a range of 86.0 to 94.5.

11. The well logging tool as set forth in claim 5, wherein the preliminary solid solder alloy composition further comprises at least 0.1 weight % Zinc.

12. The well logging tool as set forth in claim 11, wherein the preliminary solid solder alloy composition comprises a weight % of the Zinc in a range of 0.1 to 1.0.

* * * * *